(12) United States Patent
Guo et al.

(10) Patent No.: US 6,608,166 B2
(45) Date of Patent: Aug. 19, 2003

(54) THREE-DIMENSIONAL COPOLYMERS OF POLYPHENYLENE ETHER RESINSAND SYTRENIC RESINS

(75) Inventors: Hua Guo, Selkirk, NY (US); Manuel Cavazos, West Coxsackie, NY (US); John B. Yates, III, Glenmont, NY (US)

(73) Assignee: General Electric Company, Pittsfield, MA (US)

( * ) Notice: Subject to any disclaimer, the term of this patent is extended or adjusted under 35 U.S.C. 154(b) by 0 days.

(21) Appl. No.: 09/943,159

(22) Filed: Aug. 30, 2001

(65) Prior Publication Data

US 2003/0078362 A1 Apr. 24, 2003

(51) Int. Cl.⁷ .................. C08G 63/78; C08G 63/87; C08F 16/12
(52) U.S. Cl. .................. 528/205; 528/212; 528/86; 525/60; 525/63; 525/133; 525/242; 525/328.9; 525/329.1; 525/329.2; 525/330.9; 525/534
(58) Field of Search .................. 528/205, 212, 528/86; 525/63, 133, 60, 242, 328.9, 329.1, 329.2, 330.9, 534

(56) References Cited

U.S. PATENT DOCUMENTS

| | | | |
|---|---|---|---|
| 2,933,480 A | 4/1960 | Gresham et al. ........... 260/80.5 |
| 3,093,621 A | 6/1963 | Gladding ................... 260/80.5 |
| 3,211,709 A | 10/1965 | Adamek et al. ........... 260/80.7 |
| 3,306,875 A | 2/1967 | Hay | |
| 3,646,186 A | 2/1972 | Hager ........................ 264/174 |
| 3,790,519 A | 2/1974 | Wahlborg .................. 260/28.5 |
| 3,884,993 A | 5/1975 | Gros ........................... 260/897 |
| 3,894,999 A | 7/1975 | Boozer et al. ........... 260/80.78 |
| 4,059,654 A | 11/1977 | Von Bodungen et al. ... 260/897 |
| 4,166,055 A | 8/1979 | Lee, Jr. ..................... 260/30.6 |
| 4,360,618 A | 11/1982 | Trementozzi | |
| 4,456,736 A | 6/1984 | Miyashita et al. | |
| 4,481,332 A | 11/1984 | Somemiya et al. | |
| 4,578,423 A | 3/1986 | Deets et al. | |
| 4,584,334 A | 4/1986 | Lee, Jr. et al. ................. 524/92 |
| 4,614,773 A | 9/1986 | Sugio et al. | |
| 4,614,774 A | 9/1986 | Sawa et al. | |
| 4,778,849 A | 10/1988 | Bartmann et al. ............. 525/69 |
| 4,866,126 A | 9/1989 | Mylonakis et al. | |
| 5,082,898 A | 1/1992 | Minematsu et al. | |
| 5,091,480 A | 2/1992 | Percec ........................ 525/391 |
| 5,191,031 A | 3/1993 | Ueda et al. | |
| 5,231,146 A | 7/1993 | Brown et al. ................ 525/396 |
| 5,234,994 A | 8/1993 | Shiraki et al. | |
| 5,237,005 A | 8/1993 | Yates, III ...................... 525/92 |
| 5,290,881 A | 3/1994 | Dekkers ...................... 525/397 |
| 5,352,745 A | 10/1994 | Katayose et al. ........... 525/391 |
| 5,665,821 A | 9/1997 | Lim et al. | |
| 5,780,548 A | 7/1998 | Oshima et al. | |
| 5,859,130 A | 1/1999 | Gianchandai et al. ......... 525/89 |
| 5,916,970 A | 6/1999 | Lee, Jr. et al. ............... 525/133 |
| 5,981,656 A | 11/1999 | McGaughan et al. ......... 525/66 |
| 6,054,516 A | 4/2000 | Yoshida et al. | |
| 6,262,166 B1 | 7/2001 | Yoshida et al. | |

FOREIGN PATENT DOCUMENTS

| | | |
|---|---|---|
| EP | 0 106 023 A2 | 6/1983 |
| EP | 0 403 023 A2 | 6/1990 |
| EP | 129 824 B1 | 9/1992 |

OTHER PUBLICATIONS

International Search Reprot Dated Jan. 24, 2003.
WO 99/15585 Abstract.
JP 52052991 Abstract.

*Primary Examiner*—Duc Truong

(57) ABSTRACT

A three dimensional copolymer network of polyphenylene ether segments and styrenic resins such as styrene/acrylonitrile copolymers provide articles of high heat reesistance and dielectric properties suitable for use in electronic components. Methods for preparing the copolymers employ polyphenylene ether polymers with end caps having at least one pair of unsaturated aliphatic carbon atoms, i.e. carbon-carbon double bond, and polymerize styrene monomers and acrylonitrile monomers or styrene/acrylonitrile copolymers or both in the presence of these polyphenylene ether polymers.

22 Claims, No Drawings

THREE-DIMENSIONAL COPOLYMERS OF POLYPHENYLENE ETHER RESINS AND SYTRENIC RESINS

BACKGROUND OF THE INVENTION

1. Field of the Invention

The invention relates to crosslinked polyphenylene ether resins and more specifically, relates to the manufacture of three-dimensional copolymers of polyphenylene ether resins and styrenic resins.

2. Brief Description of the Related Art

Polyphenylene ether (PPE) resins (also known within the art as "Polyphenylene Oxide") are an extremely useful class of high performance engineering thermoplastics by reason of their hydrolytic stability, high dimensional stability, toughness, heat resistance and dielectric properties. PPE resins are commercially attractive materials because of their unique combination of physical, chemical, and electrical properties. This unique combination of properties renders PPE based formulations suitable for a broad range of applications which are well known in the art. One example is injection molded articles which are used for high heat applications. The more common PPE resins known in the art typically comprise polymers of a fairly high molecular weight for combination in the melt phase with other polymers. The PPE polymers of the more common PPE resins generally have in excess of 50 repeat monomer units, most often in excess of 80 or more repeat monomer units and intrinsic viscosity greater than 0.20 dl/g measured at 25° C. in chloroform.

Styrenic resins, such as styrene-acrylonitrile resins (SAN resins) are typically transparent resins used in a variety of products including housewares, packaging, appliances, industrial batteries, and automotive and medical applications. Styrenic resins are typically used in these markets because of their low unit cost and clarity. SAN resins are typically used for their heat resistance, good processability and resistance to chemicals.

BRIEF SUMMARY OF THE INVENTION

The present invention provides a composition comprising a cross-linked copolymer having PPE resin segments and segments of one or more styrene units, acrylonitrile units and combinations of styrene and acrylonitrile units. The PPE segments are derived from a PPE resin having an intrinsic viscosity of 0.20 dl/g or less as measured in chloroform at 25° C. This PPE resin comprises PPE polymer chains having at least one end cap containing at least one pair of unsaturated aliphatic carbon atoms, i.e. carbon-carbon double bonds.

The present invention also provides a method for making a cross-linked copolymer composition. This method comprises introducing a PPE resin into a reaction medium comprising styrenic monomers and acrylonitrile monomers, wherein the amount of PPE resin loaded is 20 wt % or more of the combined total of PPE resin, plus styrenic monomers and acrylonitrile monomers. The PPE resin comprises at least one PPE polymer chain having at least one end cap comprising unsaturated aliphatic carbon atoms. The PPE resin, styrenic monomers and acrylonitrile monomers introduced into the reaction medium are polymerized. The reaction medium can be a bulk reaction medium or a medium that contains another liquid that suspends or emulsifies the reaction components.

It has been discovered that three-dimensional copolymers of polyphenylene ether resins and styrenic resins can be formed by using end-capped PPE polymers having an intrinsic viscosity of 0.20 dl/g or less measured at 25° C. in chloroform.

A PPE resin comprising PPE polymer chains is employed to provide PPE segments for the crosslinked copolymer. These PPE polymers arm known polymers comprising a plurality of phenylene ether units of the formula (I):

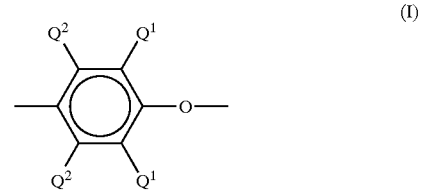

Each structural unit may be the same or different, and in each structural unit, each $Q^1$ is independently a halogen, primary or secondary lower alkyl (i.e., alkyl containing up to 7 carbon atoms), phenyl, haloalkyl, aminoalkyl, hydrocarbonoxy, or halohydrocarbonoxy, at least two carbon atoms separate the halogen and oxygen atoms; and each $Q^2$ is independently a hydrogen, halogen, primary or secondary lower alkyl, phenyl, haloalkyl, hydrocarbonoxy or halohydrocarbonoxy as defined for $Q^1$. Most often, each $Q^1$ is alkyl or phenyl, especially $C_{1-4}$ alky, and each $Q^2$ is hydrogen or alkyl ($C_{1-4}$ alkyl).

Specific polyphenylene ether polymers useful in the present invention include but are not limited to poly(2,6-dimethyl-1,4-phenyleneether);
poly (2,6-dimethyl-co-2,3,6-trimethyl-1,4-phenylene ether);
poly(2,3,6-trimethyl-1,4-phenylene ether);
poly(2,6-diethyl-1,4-phenylene ether);
poly(2-methyl-6-propyl-1,4-phenylene ether);
poly(2,6-dipropyl-1,4-phenylene ether);
poly(2-ethyl-6-propyl-1,4-phenylene ether);
poly(2,6-dilauryl-1,4-phenylene ether);
poly(2,6-diphenyl-1,4-phenylene ether);
poly(2,6-dimethoxy-1,4 phenylene ether);
poly(2,6-diethoxy-1,4-phenylene ether);
poly(2-methoxy-6-ethoxy-1,4-phenylene ether);
poly(2-ethyl-6-stearyloxy-1,4-phenylene ether);
poly(2,6-dichloro-1,4-phenylene ether);
poly(2-methyl-6-phenyl-1,4-phenylene ether);
poly(2-ethoxy-1,4-phenylene ether);
poly(2-chloro-1,4-phenylene ether);
poly(2,6-dibromo-1,4-phenylene ether);
poly(3-bromo-2,6-dimethyl-1,4-phenylene ether); or mixtures thereof.

Suitable PPE resins include homopolymers and copolymers of the structural units of formula I. The preferred homopolymers are those containing 2,6-dimethyl-1,4-phenylene ether units. Suitable copolymers include random and blocked copolymers containing such units in combination with, for example, 2,3,6-trimethyl-1,4-phenylene ether units to produce poly (2,6-dimethyl-co-2,3,6-trimethyl-1,4-phenylene ether) resins. Also included are PPE resins containing moieties prepared by grafting vinyl monomers or polymers such as polystyrenes and elastomers, as well as coupled PPE resins in which coupling agents such as low molecular weight polycarbonates, quinones, heterocycles and formals undergo reaction in a known manner with the hydroxy groups of two poly(phenylene ether) polymer chains to produce a higher molecular weight polymer, provided a substantial proportion of free hydroxyl groups remains.

The term "polyphenylene ether resin," (and "PPE resins") as used in the specification and claims herein, includes unsubstituted polyphenylene ether polymers, substituted polyphenylene ether polymers wherein the aromatic ring is substituted, polyphenylene ether copolymers and blends thereof.

The PPE resins contemplated for use in the present invention include all those presently known, irrespective of variations in structural units or ancillary chemical features which have an intrinsic viscosity (I.V.) of 0.20 dl/g or less as measured in chloroform at 25° C. by the methods described below.

Verify bath temperature is at 25° C.±0.1° C.

All I.V. measurement should be done on PPE resin that has been dried in a vacuum oven for a period of at least 1 hour at a temperature of 125° C. The dried PPE resin should be allowed to cool for about 5 minutes prior to weighing.

Using an analytical balance, place a 2 oz bottle (with cap) on balance and tare. Weigh film in the bottle, target about 0.4000 grams. Record powder weight on sample long sheet.

Tare the weight of bottle (with cap) and powder. Add 50 ml of chloroform. Record weight of the chloroform on the sample log sheet. Place bottle on shaker, shake sample until it is dissolved.

To run a sample, add about 24 ml of filtered sample (filter through 12 ml autovial filters) into viscometer. Remove filter from inlet port of viscometer. Attach squeeze bulb to vacuum line on the viscometer. Slowly draw sample up the viscometer until it is 0.6 cm above the upper measurement line. Remove the squeeze bulb and vent stopper from the viscometer. As the sample reaches the upper measurement line, begin timing of the drop using a timer. When the sample reaches the lower measurement line, stop timing.

Record drop time of sample on sample log sheet.

The I.V. can be calculated using software known in the art for such calculations.

The intrinsic viscosity of the PPE resin used to form the crosslinked copolymer of the present invention is typically in the range of about 0.08–0.20 dl/g, as measured in chloroform at 25° C.

The PPE resin herein are generally obtained by oxidative coupling at least one monovalent phenol species, preferably at least a portion of which have substitution in at least the two ortho positions and hydrogen or halogen in the para position, using an oxygen containing gas and a complex metal-amine catalyst, preferably a copper (I)-amine catalyst, as the oxidizing agent and, preferably extracting at least a portion of the metal catalyst as a metal-organic acid salt with an aqueous containing solution.

In general, the molecular weight of the polyphenylene ether resins can be controlled by controlling the reaction time, the reaction temperature and the amount of catalyst. Longer reaction times typically provide a higher average number of repeating units and a higher intrinsic viscosity. At some point, the desired molecular weight (intrinsic viscosity) is obtained and the reaction terminated by conventional means. For example, in the case of reaction systems which make use of a complex metal catalysts, the polymerization reaction may be terminated by adding an acid, e.g., hydrochloric acid, sulfuric acid and the like or a base e.g., potassium hydroxide and the like or the product may be separated from the catalyst by filtration, precipitation or other suitable means as taught by Hay in U.S. Pat. No. 3,306,875.

When combining PPE resins with other resins by either blending, curing or copolymerization reactions, including free radical reactions, it is highly desirable from the standpoints of low viscosity for mixing and a high endgroup number for functionalization to employ a PPE polymer with less than 50 repeat monomer units on average, and preferably less than about 35 repeat monomer units on average.

Recent advances in PPE resin process chemistry have allowed for the development of a low molecular weight PPE resin, an example of which is known as PPO12, which is ideally suited for forming the crosslinked copolymers of this invention. The PPO12 comprises 2,6-dimethylphenylene ether units and has an intrinsic viscosity of 0.12±0.02 dl/g as measured in chloroform at 25° C. Low molecular weight PPE resins such as PPO12 show reasonably high Tg that equates to high heat performance and have much lower melt viscosity as compared to high molecular weight grades. These two aspects are very important for performance and processibility.

The PPE resins employed to form the crosslinked copolymers of this invention have at least one end cap containing a pair of unsaturated aliphatic carbon atoms, i.e. a carbon-carbon double bond. This end cap increases the reactivity of the PPE polymer so as to facilitate copolymerization with other monomers or copolymers having unsaturated aliphatic carbon atoms such as styrene monomers, acrylonitrile monomers, styrene/acrylonitrile copolymers and combinations thereof, including optionally other polymerizable monomers.

By "capped", it is meant preferably at least about 80%, more preferably at least about 90%, most preferably at least about 95% of the PPE polymer chains have end caps with a pair of unsaturated aliphatic carbon atoms, preferably vinyl moieties. The PPE polymer chains often have Mannich end groups ((alkyl)$_2$N) formed during the polymerization. These Mannich end groups can be converted to active hydroxy end groups by known techniques to increase the number of end caps per PPE polymer, e.g., by subjecting the PPE resin to elevated temperatures such as, greater than about 150° C. preferably greater than about 180° C. or higher.

The end caps on the PPE polymer can be provided by reacting the hydroxyl groups of the PPE polymer with a suitable reactive species that provides at least one pair of unsaturated aliphatic carbon atoms. This is carried out by allowing the PPE polymers to react with a suitable capping agent. Suitable capping agents used in the present invention to introduce the aliphatic unsaturation onto the PPE include an unsaturated compound of the general formula (II):

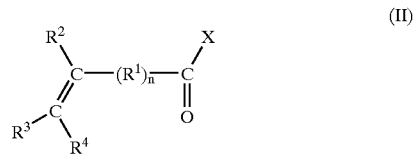

$R^1$ is an aliphatic, cyclic, or aromatic residue, for example, —CH$_2$— but may be multiple —CH$_2$— groups, e.g., n can vary from 1 to about 10 or more, or alternatively, n may equal zero wherein the formula is an acrylic residue. Each of $R^2$, $R^3$, and $R^4$ are independently hydrogen, alkyl (preferably $C_1$–$C_{10}$ alkyl), or aryl (preferably $C_6$–$C_{10}$ aryl), and X is a residue of one of the following formulae (III):

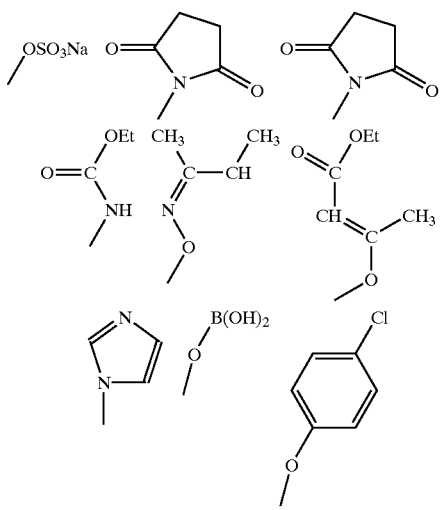

(III)

Alternatively, X may be a halogen or may be a residue of the formula (IV):

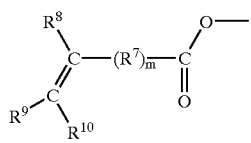

(IV)

$R^7$ is an aliphatic or aromatic residue, for example, —$CH_2$— but may be multiple —$CH_2$— groups, e.g., m can vary from 1 to about 10 or more, or alternatively, m may equal zero (if n and m both equal zero, the unsaturated compound is an acrylic anhydride). Each $R^8$, $R^9$, and $R^{10}$ are independently hydrogen, alkyl, or aryl. In a preferred embodiment, the unsaturated compound is of the formula (V):

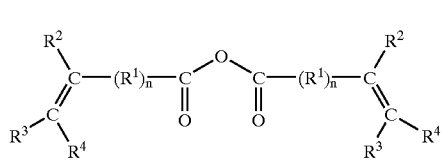

(V)

wherein each of n, $R^1$, $R^2$, $R^3$, and $R^4$ are as previously described. In an especially preferred embodiment, the unsaturated compound is of the formula (VI):

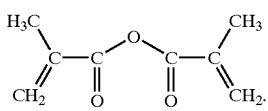

(VI)

However, included within the scope of the present invention are "mixed" or "unsymmetrical" anhydrides of formula (V).

The capping agent typically has one or more vinyl groups. The capping agent can be a styrene, a styrene based monomer, a substituted styrene, an acrylic based monomer, acrylonitrile, an acrylonitrile based monomer, an epoxy based monomer, methyl methacrylate, ethyl methacrylate, or other suitable material. The capping agent is preferably an unsaturated anhydride such as methacrylic acid anhydride.

The amount of the above mentioned end capping agents employed is preferably that required to provide at least one end cap for each PPE polymer chain.

As stated herein, the PPE polymer can be capped by the addition of at least one unsaturated anhydride such as methacrylic acid anhydride (MAA), preferably in a solution, to form capped PPE polymer referred to herein as PPE-methacrylic acid anhydride (PPE-MAA). Methacrylic acid anhydride is highly reactive in radical reactions, and is very reactive with styrenic polymers. The PPE-MAA can build into styrenic copolymers via the methacrylate double bond which remains after reaction with the PPE polymer.

The end capping reaction is typically done in the presence of at least one catalyst by conventional methods or by the methods given in the examples which follow. The catalyst is preferably an amine-type catalyst such as DMAP (N,N-dimethylaminopyridine). After the capping step, the PPE resin typically comprises PPE polymer chains having one or two end caps per polymer chain. As previously discussed, it is preferable for at least about 80%, preferably at least about 90%, more preferably at least about 95% or more of the hydroxy groups within the PPE polymer chains to be capped. In an especially preferred embodiment, substantially all of the hydroxyl moieties of the PPE have been capped. Mixtures of endcaps, including mixture of reactive and non-reactive endcaps (endcaps no containing a residual carbon-carbon double bond) may also be used.

Although not wishing to be bound by any theory on the nature or mechanism of the chemical reaction between the PPE and the unsaturated compound of formula (II), it is presumed that the functionalization of the PPE takes place through the hydroxyl groups on the PPE resulting in a PPE containing aliphatic unsaturation comprising the formula (VII):

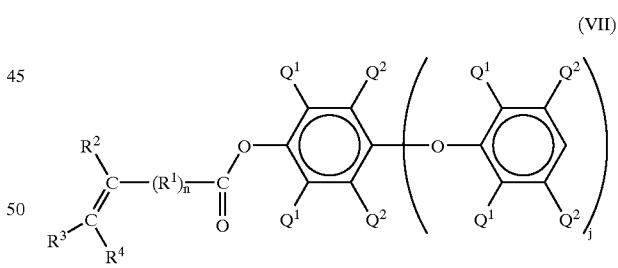

(VII)

Each of $Q^1$, $Q^2$, n, $R^1$, $R^2$, $R^3$, and $R^4$ is as previously defined and j comprises a range of values generally on average between about 10 and 110 depending in large part on the I.V. of the PPE resin.

Additionally, multiple aliphatic unsaturation can also be introduced onto the PPE polymer through incorporation of branching agents and/or coupling agents into the PPE polymer backbone structure such that more than one end of the PPE polymer contains hydroxyl groups for capping. Such branching agents and/or coupling agents are known in the art and include compounds such as, for example, tetramethylhydroquinone and trishydroxyphenol.

A reaction between PPE polymer and capping agent (MAA) is depicted in the figure below

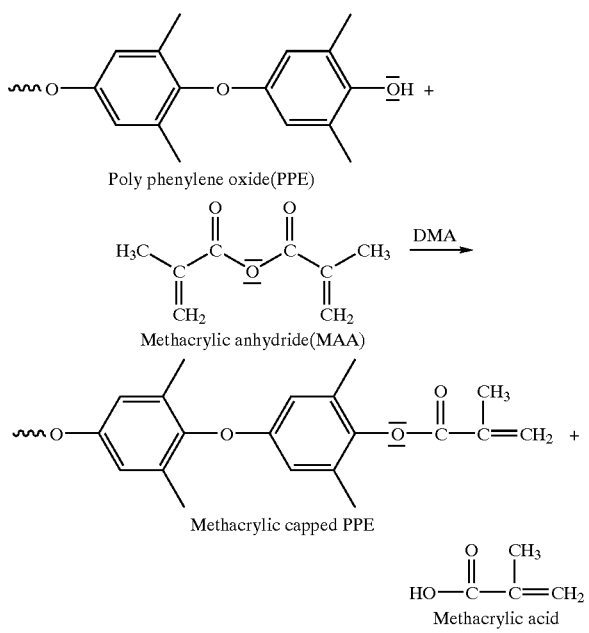

Ester formation occurs between a phenolic end group of the PPE polymer and the carboxylic group of the methacrylate.

The amount of the above mentioned end capping agents employed is preferably that required to provide, on average, at least one end cap for each PPE polymer chain. The mole ratio of capping agent to hydroxyl group per PPE polymer can range from 0.5:1 to 10:1. These reactions are typically performed at a temperature in the range of 0° C. to 100° C. in the presence of N,N-dimethylaminopyridine catalyst, (DMAP).

The PPE polymer containing an end cap having at least one pair of unsaturated aliphatic carbon atoms is capable of cross-linking or copolymerizing with other monomers, polymers or copolymers having a pair unsaturated aliphatic carbon atoms by conventional free radical polymerization techniques, typically with an initiator, such as those activated with the application of heat, U.V. radiation or electron beam radiation. An example of a suitable initiator is AIBN, (2, 2'Azo-bis isobutyronitrile). The initiators are typically added at 0.1 wt % or less. Polymerization can also proceed by conventional ionic polymerization, atom transfer polymerization and living free radical polymerization techniques.

The PPE polymers containing end caps as provided herein are copolymerized in conjunction with a) styrene and acrylonitrile monomers or b) styrene/acrylonitrile copolymers or c) a combination of styrene acrylonitrile copolymers, styrene monomers and acrylonitrile monomers to form a crosslinked copolymer. The PPE polymer chains may have two or more end caps to provide multiple reaction sites for forming crosslinks.

The segments of styrene and acrylonitrile units can be derived from styrene and acrylonitrile monomers or styrene/acrylonitrile copolymers or combinations of styrene/acrylonitrile copolymers with styrene and/or acrylonitrile monomers to make the crosslinked copolymer. Styrene/Acrylonitrile copolymers (SAN), also known as poly(styrene-co-acrylonitrile), is a typically simple random copolymers of styrene(S) monomers and acrylonitrile (AN) monomers.

A formula for SAN is shown as formula (VIII):

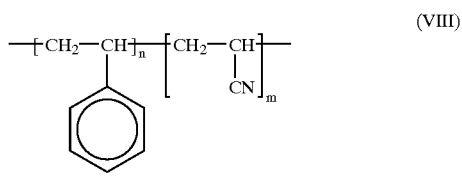

wherein n=0–100 and m=0–50.

The styrene/acrylonitrile copolymers (SAN) that can be copolymerized with PPE resin containing the end caps are preferably random copolymers of styrene and acrylonitrile, optionally containing other polymerizable monomers known in the art.

PPE resins containing at least some PPE polymer chains containing two or more end caps are believed to form crosslinked chains between SAN copolymers. With only one end cap, the PPE polymer is integrated with the styrene and acrylonitrile units to form a "comb" type structure, with the PPE polymer segments forming the "teeth" of the comb. Without end caps, the hydroxyl groups on the PPE polymer chains tend to inhibit the polymerization reactions of styrene monomer and styrene/acrylonitrile copolymers. With increasing numbers of PPE polymers having end caps containing carbon-carbon double bonds on both ends, crosslinking between the comb structures increases. The crosslinked copolymers can be derived from PPE resins comprising PPE polymer chains that have two reactive end caps. A solid three-dimensional network structure of inter-connected polymer chains is formed with S, AN and the PPE polymers having 2 or more reactive end caps. This network structure exhibits high heat resistance and solvent resistance.

The PPE-MAA polymers are attached within the three-dimensional structure via the methacrylic double bonds. Logically, cross-linking can be expected to increase with PPE-MAA polymer having methacrylate groups at both chain ends.

To insure successful copolymerization or crosslinking into a network structure, the amount of PPE polymer (loading) which is available for reaction with the SAN is controlled. The amount of capped PPE resin loaded in the reaction medium is preferably 20 wt % or more, based on the total weight of the PPE resin and the polymerizable monomers, e.g., the styrenic monomers and the acrylonitrile monomers. Preferably, the amount of PPE polymer within the reaction medium is 20 to 40 wt %.

At loading levels of 15 wt. % and less, a linear comb structure, rather than a 3-dimensional network structure results. It has also been discovered that at levels above 20 wt. % loading, the PPE-MAA and SAN typically do not polymerize well together when using the typical commercial grades of PPE resin having I.V. greater that about 0.3 as measured in chloroform at 25° C. At these loading levels and I.V., the PPE and SAN segments typically form separate polymers in the reaction mix, and settle out separately from each other. However, integrated copolymerization between the PPE and the S and AN segments at loading levels above 20 wt % can be achieved with the use of a low viscosity endcapped PPE polymer as described herein. A low viscosity PPE resin, such as those comprised of PP012-MAA polymers offers a greater number of bonding sites per amount of PPE polymer than higher molecular weight PPE polymer. The PPE resin to be used herein preferably has a viscosity of 0.20 dl/g or less, as measured in chloroform at 25° C. more preferably has a viscosity of 0.08 to 0.15 dl/g, and most preferably has a viscosity of about 0.12 dl/g.

Use of the short chain PPE, e.g., PPO12-MAA, results in increased linkage among the PPE segments and polymer segments of styrene, acrylonitrile and both styrene and acrylonitrile, enabling the formation of a three-dimensional network structure. Despite loadings of 20 wt % –40 wt %, the PPE segments can comprise up to 80% or more of the copolymer by weight after copolymerization.

The compositions of this invention can be used for a number of purposes including articles that require high heat resistance and high dielectric constants such as printed circuit boards, electronic components and flame retardant panels.

One of two methods will typically be used for crosslinking or copolymerizing the capped PPE with styrene and acrylonitrile monomers, copolymers of styrene with acrylonitrile, or both. They can be crosslinked or copolymerized using a bulk method or a suspension method. Bulk polymerization comprises performing the reaction without solvent in the presence of a liquid monomer with initiator.

Suspension polymerization is a system in which monomer is suspended as the discontinuous phase of droplets in a continuous phase and polymerized. The continuous phase is usually water, as most monomers are relatively insoluble in water. In suspension polymerization, a catalyst is dissolved in the monomer (styrene/styrene-acrylonitrile), which is dispersed in water. A dispersing agent or surfactant, e.g., poly- (vinylalcohol), is added separately to stabilize the resulting suspension. The chemical properties of products from suspension polymerization may differ from those prepared by bulk polymerization, a factor which should be considered when choosing between the methods. The usual ranges of reaction temperature for the suspension are usually between 40 and 90° C. Initiators are added in the range of 0.1 wt % of the monomer or less. The surfactant system helps establish the initial monomer, droplet size distribution, controls droplet coalescence and reduce particle agglomeration. The suspension stabilizer affects particle size and shape as well as the clarity and transparency.

Sample methods for capping the PPE, crosslinking or copolymerizing the capped PPE resin and isolating the copolymer product are illustrated herein.

EXAMPLES

Example 1

Capping PPE resin with MAA

Charge a 3-neck round-bottom flask with magnetic stirring and appropriate amounts of toluene, PPE resin (20 wt. % solids) and (1.5 wt. %) DMAP under vigorous stirring. Connect a water cooler to one neck and a nitrogen gas inlet to another. Close the third neck with a glass stopper. Apply a slow nitrogen purge. Place a flask in an oil bath stirring mechanism and let the mixture heat up to 100° C. When the PPE resin and DMAP are dissolved, start the reaction by adding the appropriate amount (3 wt % vs. PPE resin) of MAA to the mixture. When the reaction time has elapsed (after 4 hours) remove the oil bath, water cooler and nitrogen inlet tube. Cool the mixture down in a beaker with ice. After this, isolation of the product is carried out.

Example 2 (a)

Copolymerizing the PPE resin in bulk.

Charge a 3-neck roundbottom flask with a magnetic stirrer and appropriate amounts of monomers (styrene/styrene-acrylonitile) and PPE resin (more than 20 wt % of total) under stirring of 100 rpm. Connect a water cooler and nitrogen gas inlet and apply a slow nitrogen purge. Place the flask in an oil bath and let the mixture heat to the desired temperature (80° C). When the PPE resin is dissolved in toluene, start the reaction by adding the appropriate amount ($6*10^{-3}$ mol/l versus monomer) AIBN (Azo bis isobutyronitrile) to the mixture. When the reaction time is elapsed (after 1 hour), remove the oil bath and cool the mixture down so the product can be isolated.

Example 2(b)

Copolymerizing the PPE resin in suspension.

600 ml boiled demineralized water containing 1.0 g polyvinylalcohol (PVA)-dispersing agent is heated at 75° C. under continuous stirring at 250 rpm. The reaction is carried out in 1-liter reactor and under nitrogen atmosphere. In this solution is dispersed a suitable amount (20 wt % or more) of previously prepared PPE resin (for SAN suspension) in a monomer solution. After 10–20 minutes the radical initiator AIBN (0.6 g) dissolved in ca.10 g acetone is added. After a total reaction time of 7 hours, the mixture is cooled down to room temperature. The mixture is then allowed to sediment overnight. If possible, the water layer is decanted from the suspension and the product is given further treatment as needed.

Example 3

Isolating The Product (and precipitating with methanol)

The products of examples 2(a) and 2(b) are isolated by precipitation in methanol and then filtrated over a Buchnner funnel and washed several times with methanol. If the precipitation is not possible, the sample is first dissolved in chloroform and then precipitated with methanol. After that, the product is placed in a vacuum oven at desired temperature, preferably overnight to remove all the traces of styrene, methanol and water.

Table 1 illustrates the results using different loadings of PPE resins with SAN in forming a copolymer, as well as higher (0.31 dl/g) and lower (0.12 dl/g) molecular weight PPE resins. The results illustrate that crosslinked copolymers can be obtained between PPE resin and other copolymerizable resins. For example, the copolymers of samples 1, 2, and 4 were insoluble indicating a high degree of croslinking. However, the remaining samples had a lower degree of crosslinking as indicated by their solubility in chloroform. It should be clear from these data that a wide variety of crosslinked compositions can be prepared by varying the amount of PPE utilized and the I.V. of the PPE resin (the lower the I.V., the higher the concentration of reactive end caps for reaction).

TABLE 1

| Sample | Capped PPE IV | PPE Loading | Total solid (g) 20% solid on water | Mn | Mw | Dissolve for GPC | Tg C (onset) |
|---|---|---|---|---|---|---|---|
| 1 | 0.12 | 40 | 100 | — | — | No | 133 |
| 2 | 0.12 | 40 | 100 | — | — | No | 141 |
| 3 | 0.31 | 20 | 100 | 20734 | 59404 | Yes | 111 |
| 4 | 0.12 | 20 | 100 | — | — | No | 109 |
| 5 | 0.12 | 20 | 100 | 13179 | 159692 | Yes | 114 |
| 6 | 0.12 | 20 | 150 | 17441 | 123792 | Partial | 114 |
| 7 | 0.12 | 20 | 150 | 18419 | 200229 | Partial | 114 |
| 8 | 0.12 | 15 | 800 | 16791 | 78992 | Yes | 112 |

The date in Table 2 illustrate the typical properties of PPE resins. At the same weight % loading of MAA-PPE in co polymerization, 0.12 MAA capped PPE resin due to its low molecular weight will bring more "bi-functionality" into reaction system. This will leads to more potential to generate 3-dimensional crosslinking structures into the copolymer.

TABLE 2

| | Mn | Mw | Tg °C. | Initial [OH] ppm | Internal Biphenyl level % | Residue [OH] after capping |
|---|---|---|---|---|---|---|
| 0.12 IV | 3700 | 6400 | 160 | 6620 | 0.94–1.02 | 80–100 |
| 0.33 IV | 16000 | 51000 | 210 | 1031 | 0.93–0.95 | 80–100 |

The examples above are given by way of illustration and not by way of limitation and can be repeated with similar success by substituting the generically or specifically described reactants and/or operating conditions of this invention for those used in the preceding examples.

The entire disclosure of all applications, patents and publications cited herein are hereby incorporated by reference.

Although the invention has been described above in relation to preferred embodiments thereof, it will be readily understood by those skilled in the art that variations and modifications can be affected in those embodiments without departing from the scope and spirit of the invention.

What is claimed is:

1. A composition comprising:
   a cross-linked copolymer having polyphenylene ether segments, and segments of one or more styrene units, acrylonitrile units and combinations of styrene and acrylonitrile units,
   wherein the polyphenylene ether segments are derived from a polyphenylene ether resin having an intrinsic viscosity of 0.20 dl/g or less as measured in chloroform at 25° C.
   and wherein the polyphenylene ether resin comprises polyphenylene ether polymer chains having at least one end cap, said end cap having at least one pair of unsaturated aliphatic carbon atoms.

2. The cross-linked copolymer as in claim 1, wherein the copolymer is derived from the reaction of:
   a) a polyphenylene ether polymer having at least one end cap, said end cap having at least one pair of unsaturated carbon atoms, and
   b) styrene and acrylonitrile monomers or styrene/acrylonitrile copolymers or combinations of styrene/acrylonitrile copolymers with styrene monomers and acrylonitrile monomers,
   wherein the amount of polyphenylene ether polymer having at least one end cap present during reaction is 20 wt % or greater based on the combined weight of a) and b).

3. The composition as in claim 1, wherein the copolymer has an inter-connected three-dimensional type structure, and wherein the polyphenylene ether segments are interconnected with segments of comprising styrene units, acrylonitrile units or combinations of styrene and acrylonitrile units.

4. The composition as in claim 1, wherein the polyphenylene ether polymers comprises homopolymers of 2,6-dimethyl phenol or copolymers of 2,6-dimethyl phenol and 2,3,6-trimethyl phenol.

5. The composition as in claim 1, wherein the polyphenylene ether resin has an intrinsic viscosity of from 0.08 dl/g to 0.20 dl/g as measured in chloroform at 25° C.

6. The composition an in claim 1, wherein the polyphenylene ether resin has an intrinsic viscosity of 0.08 to 0.15 dl/g as measured in chloroform at 25° C.

7. The composition as in claim 1, wherein the polyphenylene ether resin has an intrinsic viscosity of 0.12±0.02 dl/g as measured in chloroform at 25° C.

8. The composition as in claim 1, wherein the polyphenylene ether polymer chains having at least one end cap are obtained by reacting a polyphenylene ether polymer having two or more hydroxyl groups per polymer chain with an anhydride capping agent.

9. The composition as in claim 1, wherein the polyphenylene ether polymer chains have at least two end caps.

10. The composition as in claim 9, wherein the end caps of the polyphenylene ether polymer chains are derived by the reaction of methacrylic acid anhydride with terminal hydroxyl groups on the polyphenylene ether polymer chains.

11. The composition as in claim 1, wherein the end caps are derived from at least one capping agent.

12. The composition as in claim 11, wherein the at least one capping agent is selected from the group consisting of styrene, substituted styrene, acrylic based (acid and acrylate) monomers, acrylonitrile and methacrylic (acid and acrylate) based monomers.

13. The composition as in claim 11, wherein the at least one capping agent is selected from a group consisting of methyl methacrylate, ethyl methacrylate and methacrylic acid anhydride.

14. The composition as in claim 1, wherein the polyphenylene ether polymer chains having at least one end cap have an intrinsic viscosity of 0.12±0.02 dl/g as measured in chloroform at 25° C.

15. The composition as in claim 1, wherein the polyphenylene ether segments comprise 5–80 wt % of the cross-linked copolymer by weight.

16. The composition according to claim 1, further comprising at least one free radical initiator that is capable of generating a free radical by heat, U.V. radiation, or electron beam radiation.

17. A method for making cross-linked a copolymer composition comprising a) introducing a polyphenylene ether resin into a reaction medium comprising styrenic monomers and acrylonitrile monomers,
   wherein the amount of polyphenylene ether resin is 20 wt % or more of the total combined weight of polyphenylene ether resin, styrenic monomers, and acrylonitrile monomers,
   and wherein the polyphenylene ether resin has an intrinsic viscosity of 0.20 dl/g or less as measured in chloroform at 25° C. and comprising at least one polyphenylene ether polymer chain having at least one end cap comprising a pair of unsaturated aliphatic carbon atoms, and
   b) polymerizing the polyphenylene ether resin, styrenic monomers and acrylonitrile monomers.

18. The method as in claim 17, wherein the polyphenylene ether polymer chains having at least one end cap have an intrinsic viscosity of 0.12±0.02 dl/g as measured in chloroform at 25° C.

19. The method as in claim 17, wherein the amount of polyphenylene ether resin loaded is 20 to 25 wt % by weight of the combined weight of the polyphenylene ether resin, styrenic monomers, and acrylonitrile monomers.

20. The method as in claim 17, wherein the amount of polyphenylene ether resin loaded is 25 to 40 wt % by weight of the combined weight of the polyphenylene ether resin, styrenic monomers, and acrylonitrile monomers.

21. The method as in claim 17, wherein the reaction medium is a bulk reaction medium and the polymerization is performed in bulk.

22. The method as in claim 17 wherein the reaction medium additionally contains a liquid wherein the liquid suspends the polyphenylene ether resin, styrenic monomers, acrylonitrile monomers, and any combination thereof and wherein the polymerization is performed in suspension.

* * * * *

UNITED STATES PATENT AND TRADEMARK OFFICE
CERTIFICATE OF CORRECTION

PATENT NO. : 6,608,166 B2
APPLICATION NO. : 09/943159
DATED : August 19, 2003
INVENTOR(S) : Hua Guo et al.

It is certified that error appears in the above-identified patent and that said Letters Patent is hereby corrected as shown below:

Title Page,
Item (54) Title, after "ETHER", delete "RESINSAND SYTRENIC" and insert therefor --RESINS AND STYRENIC--

Title Page,
Item (73) Assignee, delete "Pittsfield, MA", and insert therefor --Schenectady, NY--

Title Page,
Item (56) References Cited, Other Publications, after "Search", delete "Reprot" and insert therefor --Report--.

Column 1,
Line 2/ 3, after "ETHER", delete "RESINSAND SYTRENIC" and insert therefor --RESINS AND STYRENIC--

Column 2,
Line 29, after "$C_{1-4}$", delete "alky," and insert therefor --alkyl,--.
Line 33, after "dimethyl-1,4-" delete "phenyleneether" and insert therefor --phenylene ether--.

Column 3,
Line 20, after "I.V.", delete "measurement" and insert therefor --measurements--.
Line 28, before "sheet", delete "long" and insert therefor --log--.
Line 51, after "herein", delete "are" and insert therefor --is--

Column 4,
Line 1, after "of", delete "a".

Column 5,
Line 36, after "example," delete "-CII$_2$-" and insert therefor -- -CH$_2$- --.

Column 6,
Line 30, after "including", delete "mixture" and insert therefor --mixtures--.
Line 31, before "containing", delete "no" and insert therefor --not--.

Column 7,
Line 42, after "pair", insert therefor --of--.
Line 65, after "(styrene-co-acrylonitrile),", delete "is a" and insert therefor --are--.

UNITED STATES PATENT AND TRADEMARK OFFICE
CERTIFICATE OF CORRECTION

PATENT NO. : 6,608,166 B2
APPLICATION NO. : 09/943159
DATED : August 19, 2003
INVENTOR(S) : Hua Guo et al.

It is certified that error appears in the above-identified patent and that said Letters Patent is hereby corrected as shown below:

<u>Column 9,</u>
Line 36, after "and", delete "reduce" and insert therefor --reduces--.

<u>Column 10,</u>
Line 61, before "the", delete "llowever," and insert therefor --However,--.

<u>Column 11,</u>
Line 16, after "the" (first occurrence), delete "date" and insert therefor --data--.
Line 20, before "reaction", insert therefor --the--.
Line 20, after "will", delete "leads" and insert therefor --lead--.
Line 26, (Table 2) after "Tg" and after "level", delete "[OII]" and insert therefor --[OH]--.

<u>Column 13,</u>
Line 3, after "making", delete "cross-linked a" and Insert therefor --a cross-linked--.

Signed and Sealed this

Twenty-first Day of August, 2007

JON W. DUDAS
*Director of the United States Patent and Trademark Office*